United States Patent [19]

Watanabe et al.

[11] Patent Number: 5,196,296
[45] Date of Patent: Mar. 23, 1993

[54] EPOXY ACRYLATE RESINS AND PHOTOSENSITIVE RESIN COMPOSITIONS THEREFROM

[75] Inventors: Kazuhiro Watanabe; Takero Teramoto, both of Kawasaki, Japan

[73] Assignees: Nippon Steel Corporation; Nippon Steel Chemical Co., Ltd., Tokyo, Japan

[21] Appl. No.: 557,846

[22] Filed: Jul. 26, 1990

[30] Foreign Application Priority Data

Oct. 6, 1989 [JP] Japan .................................. 1-259942
Dec. 15, 1989 [JP] Japan .................................. 1-323829

[51] Int. Cl.$^5$ .................... G03F 7/027; C08F 283/00; C08F 36/00
[52] U.S. Cl. .................... 430/288; 522/100; 522/103; 560/221; 560/209; 526/284; 525/922; 525/531
[58] Field of Search ............... 522/100, 103; 560/221, 560/209; 526/284; 525/922, 531; 430/288

[56] References Cited

U.S. PATENT DOCUMENTS

| | | | |
|---|---|---|---|
| 4,122,113 | 10/1978 | Turner | 560/221 X |
| 4,252,888 | 2/1981 | Rohloff | 430/285 X |
| 4,264,708 | 8/1981 | Chambers et al. | 430/288 X |
| 4,663,412 | 5/1987 | Guillet et al. | 526/284 |

FOREIGN PATENT DOCUMENTS

| | | |
|---|---|---|
| 49-107048 | 10/1974 | Japan . |
| 52-117985 | 3/1977 | Japan . |
| 53-56018 | 5/1978 | Japan . |
| 54-1018 | 1/1979 | Japan . |
| 55-127097 | 10/1980 | Japan . |

*Primary Examiner*—Cynthia Hamilton
*Attorney, Agent, or Firm*—Armstrong, Westerman, Hattori, McLeland & Naughton

[57] ABSTRACT

Epoxy acrylate resins of this invention having a structure of the general formula (I)

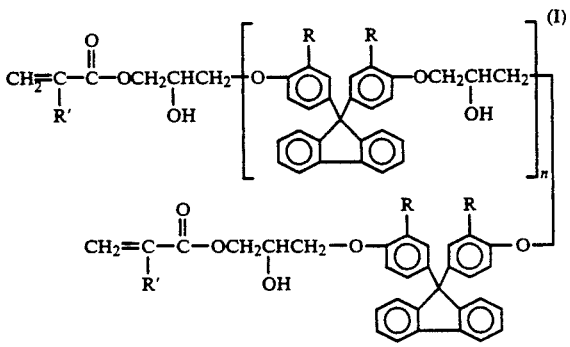

in which R is hydrogen or a lower alkyl group, R' is hydrogen or methyl group, and n is an integer from 0 to 20 are heat-resistant, solvent-soluble, and photosensitive and photosensitive resin compositions containing said epoxy acrylate resins as main component exhibit high photosensitivity in addition to strong adhesion to substrates, good resistance to heat and chemicals, and good mechanical and electrical properties and are useful as materials for forming insulation films for multilayer devices and protective films for image sensors and as protective films for solder resists, plating resists, and color filters.

2 Claims, 3 Drawing Sheets

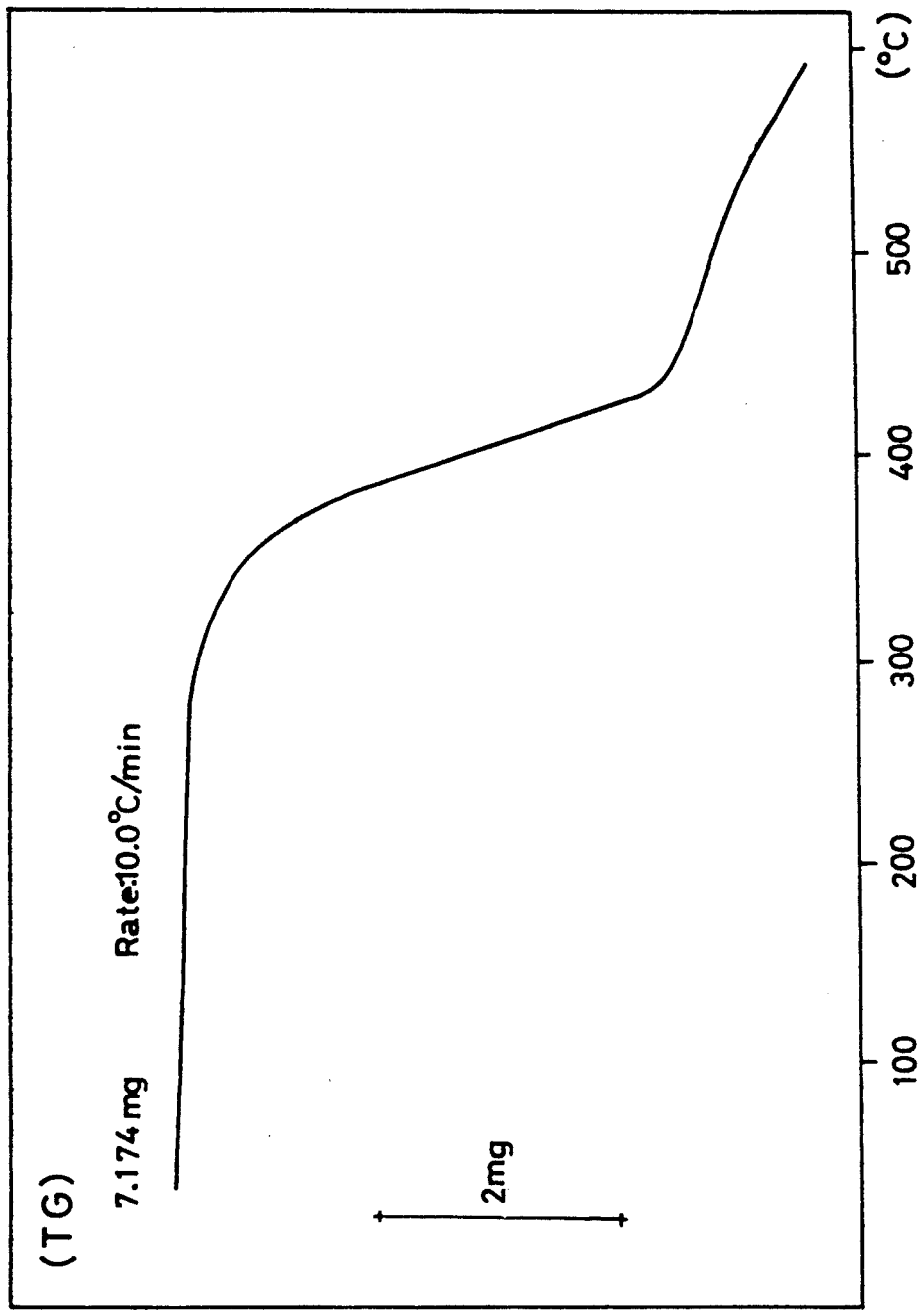

EPOXY ACRYLATE RESINS AND PHOTOSENSITIVE RESIN COMPOSITIONS THEREFROM

FIELD OF THE INVENTION AND RELATED ART STATEMENT

This invention relates to novel epoxy acrylate resins which are heat-resistant, solvent-soluble, and photosensitive and to photosensitive resin compositions containing said epoxy acrylate resins.

The epoxy acrylate resins of this invention are homopolymerized or copolymerized with a variety of compounds having olefinic double bonds to yield epoxy acrylate polymers of excellent thermal, chemical, and light stability useful for a variety of applications.

The photosensitive resin compositions of this invention possess properties required for solder resists or electroless plating resists in the fabrication of printed wiring boards and printed circuit boards and are useful for permanent protective masks.

Epoxy acrylate resins as functional polymers have been used in many areas such as photosensitive materials, optical materials, dental materials, and crosslinking agents for various polymers. In recent years, a demand has arisen for advanced functionality in epoxy acrylate resins such as improved heat and weather resistance and higher refraction. The fact, however, is that the known epoxy acrylate resins do not necessarily satisfy such a demand.

On the other hand, it is a well-known practice to apply photosensitive resin compositions as plating or etching resists in the precision processing industry, for example, in the manufacture of printed wiring boards. Also, such photosensitive resin compositions have recently come to be used in the area of permanent masks such as electroless plating masks and solder masks.

Photosensitive resin compositions useful for permanent masks are disclosed, for instance, in Japan Tokkyo Kokai Koho Nos. 52-117,985 (1977), 54-1,018 (1979), and 53-56,018 (1978). These compositions, however, are mainly composed of polymeric binders and monomers and are unfit for forming protective films of increased thickness for the following reason. On account of polymeric binders of a relatively high glass transition temperature being used in the compositions, a photosensitive layer must be made by dissolving or dispersing the compositions in question in an organic solvent such as toluene, ethyl cellosolve, methyl ethyl ketone, and methylene chloride, applying the solution or dispersion to a substrate, and drying the coated substrate. In consequence, the formation of air bubbles and the flow of resins tend to occur more easily in the course of drying as the film thickness increases, thus making it difficult to attain uniformity in protective films of increased thickness.

Solventless liquid photosensitive resin compositions are proposed for permanent masks in Japan Tokkyo Kokai Koho Nos. 55-127,097 (1980) and 49-107,048 (1974). These compositions, however, are not suitable for forming protective films of increased thickness and higher resolution. They contain epoxy acrylate resins of poor solubility and suffer from a poor developing quality. It is difficult for the compositions to form images of increased thickness and higher resolution by developing with fire-resistant solvents, such as 1, 1, 1-trichlorethane, which are commonly used in developing photosensitive films for etching and plating (for example, Riston from E. I. duPont de Nemours & Co. and Photec from Hitachi Chemical Co., Ltd.). Moreover, they do not necessarily show sufficient photosensitivity. On the other hand, phenol novolak epoxy resins are similar in structure to cresol novolak epoxy resins and show excellent heat resistance, but they are not suitable for photosensitive materials on account of their extremely low solubility in 1, 1, 1-trichloroethane.

OBJECT AND SUMMARY OF THE INVENTION

It is an object of this invention to provide epoxy acrylate resins which are heat-resistant, solvent-soluble, and photosensitive and are extremely useful for monomers and polymers convertible to functional polymeric materials such as optical materials and crosslinking agents for a variety of polymers.

Another object of this invention is to provide photosensitive resin compositions which have overcome the shortcomings of the aforesaid prior art technologies relating to photosensitive resins and are able to form images of increased thickness and higher resolution by development with a fire-resistant compound such as 1, 1, 1-trichloroethane and form permanent protective masks of excellent heat resistance, alkali resistance, electrical insulation, and mechanical strength.

Accordingly, this invention provides epoxy acrylate resins of the following general formula (I)

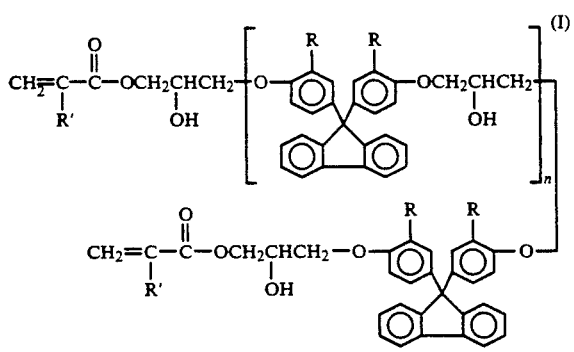

in which R is hydrogen or a lower alkyl group, R' is hydrogen or methyl group, and n is an integer from 0 to 20.

This invention further provides photosensitive resin compositions which comprise 15 to 90% by weight of the epoxy acrylate resins of the aforesaid general formula (I) and 10 to 85% by weight of unsaturated polyesters having a structural unit of the following general formula (II)

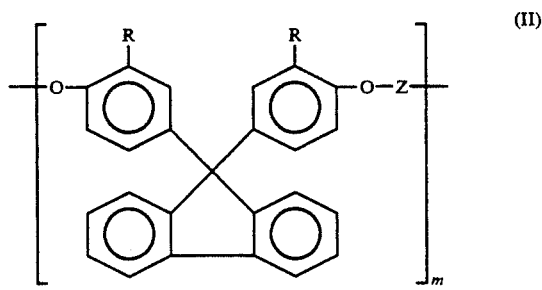

in which Z is —CO—CH=CH—CO—, R is hydrogen or a lower alkyl group, and m is the number of repeating structural units and showing an inherent viscosity of 0.3 to 2.5 dl/g.

This invention still further provides photosensitive resin compositions which comprise 15 to 90% by weight of the epoxy acrylate resins of the aforesaid general formula (I) and 10 to 85% by weight of at least one compound selected from trifunctional and higher acrylates and epoxy acrylates.

In the photosensitive resin compositions of this invention, the epoxy acrylate resins of the aforesaid general formula (I) are used as binder-like components. The epoxy acrylate resins in question are obtained by dissolving epoxy resins of the following general formula (III),

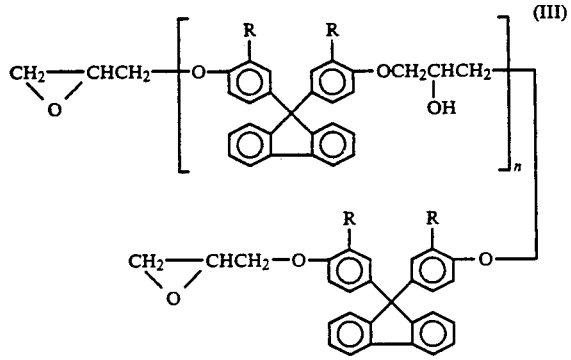

which results from the aforesaid general formula (I) when both ends are replaced with glycidyl groups and in which R is as defined above, in a solvent such as ethyl cellosolve acetate and allowing them to react with acrylic acid or methacrylic acid at 110° to 120° C. in the presence of 2-ethyl-4-imidazole or triethylbenzylammonium chloride as a catalyst. The epoxy acrylate resins thus prepared are semisolid or solid depending upon the molecular weight of the feed epoxy resins and all show adhesive properties.

The aforesaid epoxy acrylate resins or photosensitive resin compositions may be applied directly as liquid or after dilution with an adequate amount of a solvent. The solvents useful for this purpose include low-boiling solvents such as acetone, ethyl acetate, tetrahydrofuran, dioxane, chloroform, and carbon tetrachloride and ethyl cellusolve acetate, N,N-dimethylforamide, and N-methylpyrrolidone. They may be used singly or as a mixture of two or more.

In this invention, the dihydric alcohol (diol) components in the general formulas (I) and (II) are generally derived from diols of the following general formula (IV)

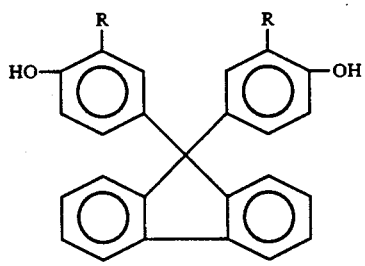

in which R is as defined above. The substituent R here is hydrogen or a lower alkyl group such as methyl and ethyl. The diol components vary with the feed diols, which include 9,9-bis(4-hydroxyphenyl)fluorene, 9,9-bis(3-methyl-4-hydroxyphenyl)fluorene, and 9,9-bis(3-ethyl-4-hydroxyphenyl)fluorene.

The epoxy resins of the general formula (III) are synthesized by a procedure similar to that for common epoxy resins, for example, by melting a diol of the general formula (IV) and a suitable amount of epichlorohydrin in the presence of a basic catalyst under heat to effect the ring-opening polymerization. The number n in the desired product can be controlled by changing the ratio of the diol component to epichlorohydrin in the feed. This number can be identified by gel permeation chromatography (GPC).

The acrylate group to be added to the terminal epoxy group may be photopolymerizable acrylic acid or methacrylic acid. It is advisable to add a thermal polymerization inhibitor such as hydroquinone, p-methylquinoline, and phenothiazine on the order of several ppm based on the resins during the addition reaction.

Good solubility of the epoxy acrylate resins of the general formula (I) in 1,1,1-trichloroethane, the main component of developers for photoresists, helps to reduce the developing time markedly. The unexposed resins are also soluble in the developer and the plugs of resist in small holes with a diameter of 0.4 mm or 0.3 mm can be developed away. Moreover, the epoxy acrylate resins of this invention are highly resistant to chemicals, heat, and fire, and provide resists of good resistance to acids, alkalis, heat in a soldering bath, and fire when applied as photoresists.

The photosensitive resin compositions of this invention are formulated from 15 to 90% by weight, preferably 20 to 85% by weight, of the epoxy acrylate resins of the aforesaid general formula (I) and 10 to 85% by weight, preferably 15 to 80% by weight, of the unsaturated polyesters having the structural unit of the aforesaid general formula (II) and exhibiting an inherent viscosity of 0.3 to 2.5 dl/g or from 15 to 90% by weight, preferably 20 to 85% by weight, of the epoxy acrylate resins of the general formula (I) and 10 to 85% by weight, preferably 20 to 85% by weight, of one or more compounds selected from trifunctional and higher acrylates and epoxy acrylates. In addition to the components just described, the aforesaid photosensitive resin compositions may contain binders, photosensitive compounds, photosensitizers, and the like as needed. The formulating ratio above indicates the proportion of each component in % by weight based on the total weight of the photosensitive resin compositions less solvent as 100%.

The epoxy acrylate resins of the aforesaid general formula (I) present problems in photocurability and adhesion to substrates when added in a proportion of 15% by weight or less while they make the solution too viscous for easy handling when added in excess of 90% by weight. It is to be noted that the epoxy acrylate resins of the general formula (I) with n in excess of 20 also become too viscous, causing the same problem of inconvenient handling as encountered in the addition of more than 90% by weight.

The underlying concept in the photosensitive resin compositions of this invention is to combine the heat resistance and photocurability of the unsaturated polyesters of the aforesaid general formula (II) with the photocurability and improved adhesion to substrates of the epoxy acrylate resins. Whenever the adhesion between a resist and a copper substrate is not sufficiently strong, the etching or plating solution penetrates into the interface between the resist and the copper substrate, thereby causing the resist to delaminate from the copper substrate. This results in damages of the edges of the resists by etching or undesirable penetration of the plating solution and these phenomena blur the linearity of the section of the images and make it impossible to obtain copper substrates with finely-patterned images.

The unsaturated polyesters of the general formula (II) to be used in this invention can be prepared by the esterification reaction of acid components containing photopolymerizable carbon-carbon double bonds with diols of the general formula (IV). Such acids include fumaric acid and maleic acid.

An explanatory description will be given on a process for the preparation of the unsaturated polyesters of the aforesaid general formula (II) of this invention.

A diol of the general formula (IV) is dissolved in an aqueous alkaline solution under heat. No specific limitation exists for the alkali in the aqueous alkaline solution and a caustic alkali such as sodium hydroxide and potassium hydroxide is preferable. An adequate amount of such alkali is 1.2 to 2.0 times that of the diol.

Another raw material, namely an acid component, to be used with the aforesaid diol is fumaric or maleic acid. The acid is applied directly as it is or as its acid halide, diester, or acid anhydride and the acid chloride is preferable. It is desirable to apply the acid as a solution in an organic solvent such as 1,2-dichloroethane, chloroform, and 1,1,2,2-tetrachloroethane.

The organic solution of the acid component is then added in drops to the aqueous alkaline solution of the diol with vigorous stirring to effect the interfacial polycondensation. The reaction, taking place at the interface, is accelerated by addition of a suitable amount of phase-transfer catalysts to the reaction mixture. The phase-transfer catalysts include surfactants such as tetraethylammonium chloride and triethylbenzylammonium chloride. The usual amount of the catalyst for interfacial polycondensation reactions in general is sufficient here, normally an amount to provide an aqueous solution of 2% by weight or less. An excessive addition sometimes undesirably emulsifies the reaction mixture and keeps the degree of polymerization at a low level. The reaction temperature is from 10° to 50° C., preferably from 20° to 30° C., and the reaction time is 15 to 20 minutes.

Upon completion of the reaction, the organic layer is separated from the aqueous layer, washed with a small amount of water, mixed with an organic solvent such as chloroform to lower the viscosity, poured into methanol or acetone, and the precipitates are collected by filtration and dried to yield the unsaturated polyesters of this invention.

The unsaturated polyesters of this invention should show an inherent viscosity $(\eta_{inh})$ of 0.3 to 2.5 dl/g, preferably 0.5 to 2.0 dl/g. Unsaturated polyesters with an inherent viscosity $(\eta_{inh})$ of less than 0.3 dl/g sometimes do not fully manifest their film-forming properties while those with an inherent viscosity in excess of 2.5 dl/g become less easy to work with. The inherent viscosity $(\eta_{inh})$ is determined at 30° C. on a solution of 0.5 g of the unsaturated polyester in 100 ml of dimethylformamide.

The proportion of the aforesaid unsaturated polyesters in the photosensitive resin compositions of this invention is 10 to 85% by weight, preferably 15 to 80% by weight. A porportion of less than 10% by weight lowers the heat resistance and photocurability while a proportion in excess of 85% by weight raises the degree of crosslinking so high as to cause defects such as cracking and breakage in the cured films.

A solder resist film obtained from the photosensitive resin compositions of this invention is cured by the irradiation with a light in the selective wavelength range from 200 to 500 nm, preferably from 300 to 450 nm.

Moreover, the photosensitive resin compositions of this invention may contain a variety of polyfunctional acrylates as photosensitive components in place of the aforesaid unsaturated polyesters. The epoxy acrylate resins constituting the main component of the compositions are bifunctional with each functional group located at the end and it is beneficial to use simultaneously one or more of trifunctional and higher acrylates and epoxy acrylates for further improvement of the surface curability and photosensitivity. The trifunctional and higher acrylates and epoxy acrylates useful for this purpose include poly(meth)acrylates of trihydric and higher aliphatic alcohols such as trimethylolpropane tri(meth)acrylate, trimethylolethane tri(meth)acrylate, pentaerythritol tetra(meth)acrylate and novolak epoxy acrylates. The proportion of such trifunctional and higher acrylates and epoxy acrylates is set in the range from 10 to 85% by weight, preferably 15 to 80% by weight, of the entire resins in consideration of the heat resistance and adhesion.

The photosensitive resin compositions of this invention may be used with those photopolymerization initiators which are generally known to be effective for acrylates. Though there is no specific limitation, examples of such photopolymerization initiators include biacetyl, benzophenone, benzil, benzoin isobutyl ether, benzil dimethyl ketal, (1-hydroxycyclohexyl) phenyl ketone, 2-hydroxy-2-methylpropiophenone, diethylthioxanthone, ethylanthraquinone, and bis(diethylamino) benzophenone and composites of the preceding compounds with amines such as ethyl (N,N-dimethylamino)benzoate, benzyldimethylamine, triethanolamine, and N,N-dimethylethanolamine.

The photosensitive resin compositions of this invention are applied to the substrates for the preparation of printed circuit boards, for example, to glass-epoxy resin laminates, dried, irradiated with ultraviolet rays through a specified negative mask, developed by an organic solvent, and baked to form plating resist patterns.

To be more specific, a photosensitive resin composition obtained in the aforesaid manner is applied to a substrate such as a glass-epoxy resin laminate by spin coating or screen printing or by contact bonding under heat of a dry film prepared from the composition. It is desirable to roughen the surface of the substrate by a solvent or by mechanical abrasion in order to improve the adhesion between the substrate and the film.

When the resist obtained by the application of the aforesaid photosensitive composition to the substrate is liquid, it is prebaked at a given temperature for a given length of time to let the greater part of the solvent to evaporate, then placed in close contact with a negative mask, and exposed to light. In the case of a dry resist film that has been stripped of the solvent in advance, it is contact-bonded to the substrate, left at room temperature for 20 minutes, and exposed to light through a negative mask put on the cover film of the dry resist film.

The resist thus exposed is then developed by spraying or ultrasonic treatment with 1,1,1-trichloroethane and the like, washed with water, and dried.

The plating resist patterns obtained in this manner have a resolution of 60 μm and produce no change when immersed in an electroless plating bath at pH 12.5 and at a temperature of 70° to 80° C. for 24 hours or more, thus proving their sufficient resistance to an electroless plating bath.

When a copper-clad glass-epoxy resin laminate having drilled holes with a diameter of 0.3, 0.4, 0.5, or 0.9 mm is coated with the photosensitive resin composition of this invention to a dry thickness of 30 μm by a roll coater and submitted to patterning, the resist inside the 0.5-mm or 0.9-mm holes can be developed in a time twice to three times longer than that required for developing the resist on the surface while the developing of the resist inside the 0.3-mm holes takes 4 to 5 times longer. In either case, the patterns on the surface are not affected at all and no loss in the film thickness occurs in the exposed area.

The photosensitive resin compositions of this invention utilize epoxy acrylate resins as binders and, as a consequence, form nonadhesive solid films or slightly adhesive semisolid films upon evaporation of the solvent. Hence, it becomes possible to apply the compositions in the form of either a solvent type resist or a dry film type resist. Moreover, the diol components used in this invention help to reduce the developing time with a halogen-containing solvent.

As described above, the epoxy acrylate resins of this invention are novel resins with excellent heat resistance, good solubility in solvents, and high photosensitivity and the photosensitive resin compositions of this invention containing said epoxy acrylate resins produce strong adhesion to substrates, show good mechanical and electrical properties, excellent heat and chemical resistance, and high photosensitivity, and are suitable as materials for forming insulation films for multilayer devices and protective films for image sensors and as protective films for solder resists, plating resists, and color filters.

BRIEF DESCRIPTION OF THE DRAWINGS

FIG. 3 shows a thermogravimetric (TG) chart of the cured film of the epoxy acrylate resin in Example 1.

DETAILED DESCRIPTION OF THE PREFERRED EMBODIMENTS

This invention will be explained in detail below with reference to the accompanying examples and comparative examples.

EXAMPLE 1

In a 500-ml four-necked flask were placed 231 g of epoxy resin of the general formula (III) (epoxy equivalent=231, n=0, R=H) and 100 g of ethyl cellosolve acetate, the mixture was heated at 120° C. until a complete solution occurred, and the solution was mixed with 450 mg of triethylbenzylammonium chloride, 100 mg of phenothiazine, and 72.0 g of acrylic acid and allowed to react with stirring for 8 hours. The acid value of the reaction mixture was determined in the course of the reaction and heating was continued with stirring until the acid value became less than 2.0 mg KOH/g.

When the acid value reached the target, the mixture was allowed to cool at room temperature to give epoxy acrylate resin (Sample 1), which was dried at 30° C. under reduced pressure for one day.

The epoxy acrylate thus prepared was submitted to structural determination with the following results.

① Melting point: 49°–51° C.

| ② Elementary analysis: | | |
|---|---|---|
| | C (% by weight) | H (% by weight) |
| Calculated | 73.29 | 5.60 |
| Found | 73.20 | 5.62 |

| ③ $^1$H-NMR (Solvent, CDCl$_3$; internal standard, TMS) (n = 0) | |
|---|---|
| Peak | δ, ppm |
| k | 2.10 | 2H |
| a, b | 3.55–4.09 | 10H |
| c, d, e | 5.35–6.50 | 6H |
| f | 6.25–6.50 | 4H |
| g | 6.65–6.85 | 4H |
| i | 6.75–6.95 | 4H |
| j | 6.95–7.15 | 2H |
| h | 7.30–7.48 | 2H |

Figure 1:
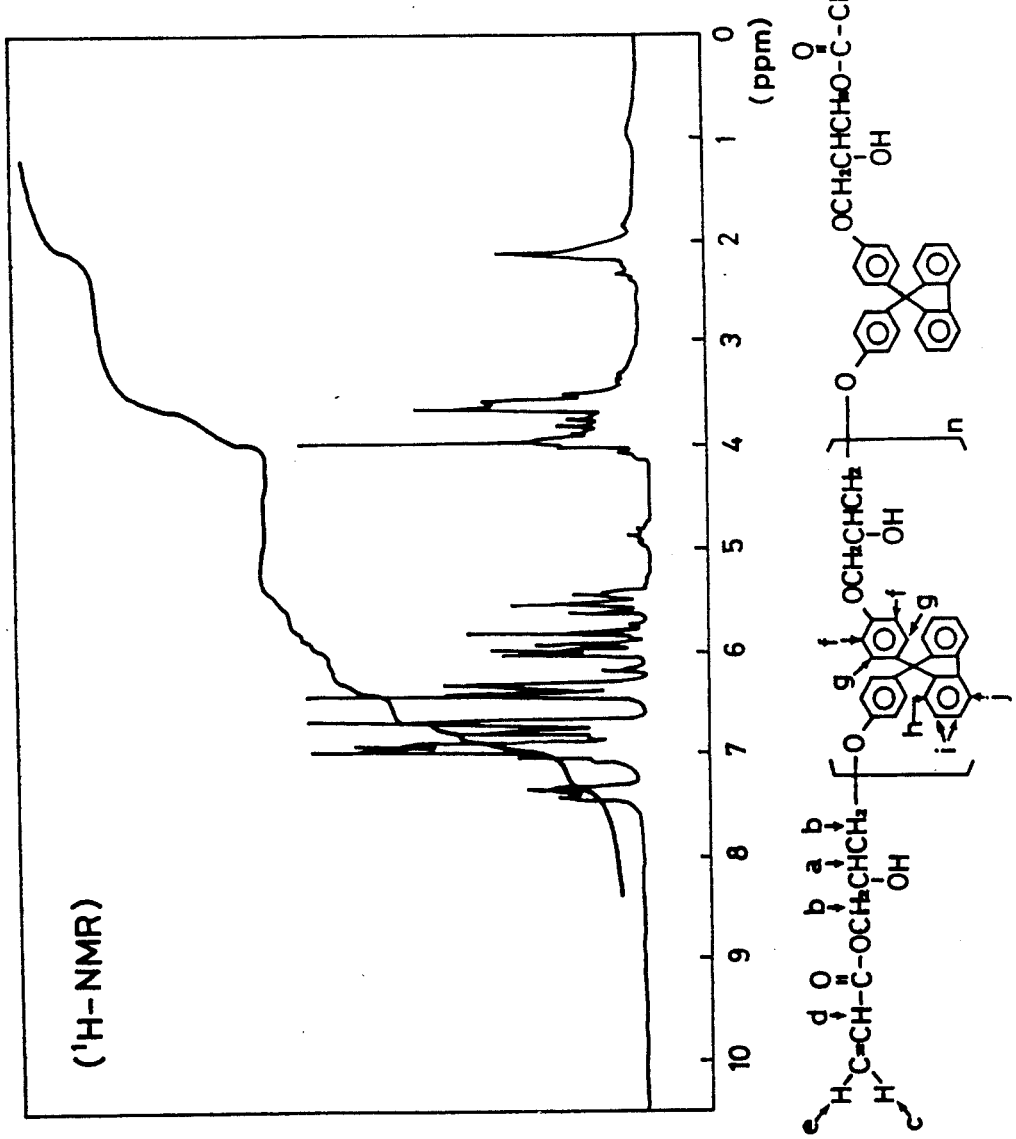
FIG. 1 shows a nuclear magnetic resonance spectrum ($^1$H-NMR) of the epoxy acrylate resin in Example 1 of this invention.

Refer to FIG. 1 for the nuclear magnetic resonance spectrum

④ IR (KBr tablets): 1720 cm$^{-1}$ (Ester group $\nu_{C=O}$); 1600 cm$^{-1}$ ($\nu_{C=C}$); 3070 cm$^{-1}$ (Benzene ring $\nu_{C-H}$).

Figure 2:
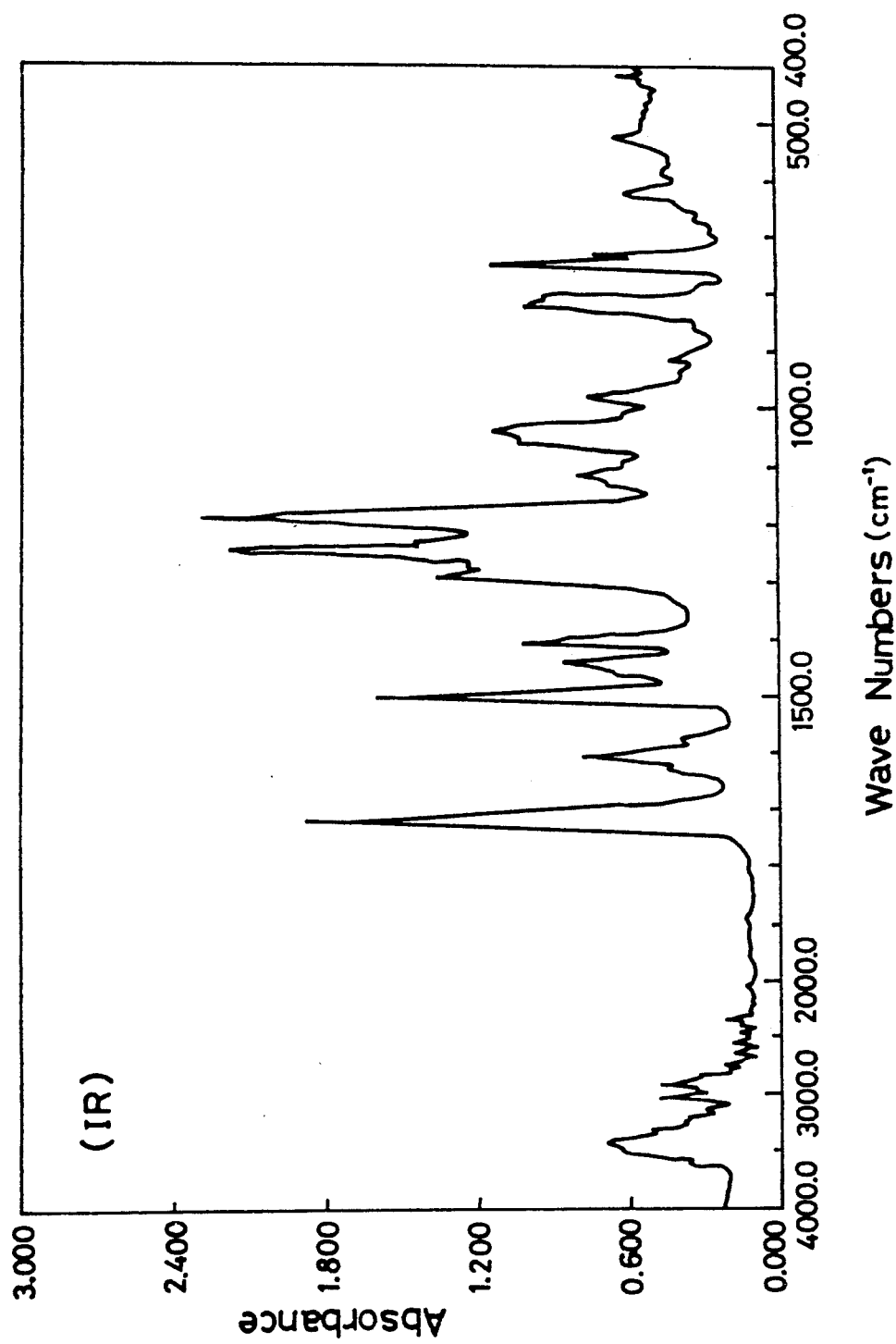
FIG. 2 shows an infrared absorption spectrum (IR) of the epoxy acrylate resin in Example 1.

Refer to FIG. 2 for the infrared absorption spectrum.

⑤ MS (EI 70 eV), m/n=605.29 (m$^+$)

Test for Photosensitivity

Sample 1 was mixed with 3% of its weight of Michler's ketone as a photosensitizer and the resulting solution was applied by spin coating to prepare a specimen with a dry film thickness of 50 μm. The specimen was then exposed to a superhigh-pressure mercury lamp at a quantity of light of 300 mj/cm$^2$.

Test for Heat Resistance

A thermogravimetric analysis was carried out on the aforesaid cured film. The temperature for the inception of weight loss was 280° C. The results are shown in FIG. 3.

Test for Optical Properties

The refractive index of the aforesaid cured film was found by an Abbe refractometer to be 1.605.

The above-mentioned results have indicated that the epoxy acrylate resins of this invention possess high photosensitivity, heat resistance, and refractive index.

EXAMPLE 2

In a 500-ml fournecked flask were placed 434 g of epoxy resin of the general formula (III) (epoxy equivalent=434, n=1, R=H) and 100 g of ethyl cellosolve acetate, the mixture was heated at 120° C. until a complete solution occurred, and the solution was mixed with 450 mg of triethylbenzylammonium chloride, 100 mg of phenothiazine, and 72.0 g of acrylic acid and heated with stirring until the acid value became less than 2.0 mgKOH/g as in Example 1. When the acid value reached the target, the mixture was allowed to cool at room temperature to give epoxy acrylate resin (Sample 2), which was dried at 50° C. under reduced pressure for one day.

The epoxy acrylate resin thus obtained was submitted to structural determination as in Example 1.

① Melting point: 121°-123° C.

② Elementary analysis:

|  | C (% by weight) | H (% by weight) |
|---|---|---|
| Calculated | 75.90 | 5.53 |
| Found | 75.92 | 5.58 |

The $^1$H-NMR and IR spectra for n=1-20 are roughly equal to those for n=0. As the number n increases, the integral ratio (5.35-6.50 ppm) of the proton (H) in the acrylic group to the total becomes smaller in the $^1$H-NMR spectrum and the absorption intensity at 1720 cm$^{-1}$ and 1600 cm$^{-1}$ decreases in the IR spectrum.

EXAMPLE 3

A photosensitive resin composition was prepared according to the following procedure.

An organic solution of the acid component was prepared by dissolving 15.3 g of fumaroyl chloride in 300 ml of 1,2-dichloroethane.

In a mixt. of 1,000 ml of water and 100 ml of a 4N aqueous alkaline solution were dissolved 35 g of 9,9-bis(4-hydroxyphenyl)fluorene and 15 g of triethylbenzylammonium chloride, the aforesaid organic solution of the acid component was added at once with vigorous stirring, and the mixture was allowed to react for 15 to 20 minutes.

Upon completion of the reaction, the aqueous layer was discarded and the organic layer was washed twice with 500 ml of water. After the washing, 200 ml of 1,2-dichloroethane was added to the organic layer to lower the viscosity, the mixture was poured into acetone, and the precipitates were collected by filtration and dried to give unsaturated polyester of the general formula (II).

The polyester thus prepared showed an inherent viscosity ($\eta_{inh}$) of 1.0 dl/g and a glass transition temperature of 310° C.

A blend of the epoxy acrylate resin (Sample 1) obtained in Example 1 and the aforesaid unsaturated polyester of the general formula (II) was mixed uniformly with benzophenone and Michler's ketone as photosensitizers and ethyl cellosolve acetate as solvent in a three-roll mill to prepare Sample A of photosensitive resin composition.

| Composition of Sample A (% by weight) | |
|---|---|
| (a) Epoxy acrylate resin (Sample 1) | 60 |
| (b) Unsaturated polyester of the general formula (II) | 15 |
| (c) Benzophenone | 2 |
| (d) Michler's ketone | 3 |
| (e) Ethyl cellosolve acetate | 20 |

EXAMPLE 4

The following photosensitive resin composition (Sample B) was prepared as in Example 3 except using the epoxy acrylate resin (Sample 2) obtained in Example 2.

| Composition of Sample B (% by weight) | |
|---|---|
| (a) Epoxy acrylate resin (Sample 2) | 55 |
| (b) Unsaturated polyester of the general formula (II) | 10 |
| (c) Benzophenone | 2 |
| (d) Michler's ketone | 3 |
| (e) Ethyl cellosolve acetate | 30 |

EXAMPLE 5

The following photosensitive resin composition (Sample C) was prepared as in Example 3 using the epoxy acrylate resin (Sample 1) obtained in Example 1, a phenol novolak epoxy acrylate (molecular weight=3000) and dipentaerythritol hexaacrylate (DPHA; a product of Nippon Kayaku Co., Ltd.) as polyfunctional acrylates in place of the unsaturated polyester of the general formula (II), Irgacure 651 (a product of Ciba-Geigy Japan, Ltd.) as photosensitizer, and ethyl cellosolve acetate as solvent.

| Composition of Sample C (% by weight) | |
|---|---|
| (a) Epoxy acrylate resin (Sample 1) | 50 |
| (b) Phenol novolak epoxy acrylate | 25 |
| (c) Dipentaerythritol hexaacrylate | 5 |
| (d) Irgacure 651 (a product of Ciba-Geigy Japan, Ltd.) | 2 |
| (e) Michler's ketone | 3 |
| (f) Ethyl cellosolve acetate | 15 |

EXAMPLE 6

The following photosensitive resin composition (Sample D) was prepared as in Example 5 except using the epoxy acrylate resin (Sample 2) obtained in Example 2.

| Composition of Sample D | |
|---|---|
| (a) Epoxy acrylate resin (Sample 2) | 40 |
| (b) Phenol novolak epoxy acrylate | 20 |
| (c) Dipentaerythritol hexaacrylate | 10 |
| (d) Irgacure 651 (a product of Ciba-Geigy Japan, Ltd.) | 2 |
| (e) Michler's ketone | 3 |
| (f) Ethyl cellosolve acetate | 25 |

COMPARATIVE EXAMPLES

Photosensitive resin compositions (Samples E, F, and G) of Comparative Examples 1 to 3 were prepared using the compounds in the above-mentioned Examples while varying the mixing ratio.

COMPARATIVE EXAMPLE 1

Composition of Sample E (% by weight)

| (a) Epoxy acrylate resin (Sample 2) | 10 |
|---|---|
| (b) Unsaturated polyester of the general formula (II) | 65 |
| (c) Benzophenone | 2 |
| (d) Michler's ketone | 3 |
| (e) Ethyl cellosolve acetate | 20 |

COMPARATIVE EXAMPLE 2

Composition of Sample F (% by weight)

| (a) Epoxy acrylate resin (Sample 2) | 70 |
|---|---|
| (b) Unsaturated polyester of the general formula (II) | 5 |

| -continued | |
|---|---|
| (c) Benzophenone | 2 |
| (d) Michler's ketone | 3 |
| (e) Ethyl cellosolve acetate | 20 |

COMPARATIVE EXAMPLE 3

Composition of Sample G (% by weight)

| | |
|---|---|
| (a) Epoxy acrylate resin (Sample 2) | 5 |
| (b) Phenol novolak epoxy acrylate | 55 |
| (c) Dipentaerythritol hexaacrylate | 15 |
| (d) Irgacure 651 (a product of Ciba-Geigy Japan, Ltd.) | 2 |
| (e) Michler's ketone | 3 |
| (f) Ethyl cellosolve acetate | 20 |

EXAMPLES OF TESTING

The photoresists of the above-mentioned examples and comparative examples were each applied by a roll coater to a glass-epoxy resin laminate with drilled holes of a diameter of 0.3, 0.4, 0.5, and 0.9 mm, left in a stream of air of 80° C. for 40 minutes, placed in close contact with a negative mask containing line and space patterns of 30 to 200 μm and circular patterns with a diameter of 0.1 to 1.4 mm, and exposed to a superhigh-pressure mercury lamp at a quantity of light of 300 mj/cm$^2$.

The mask was removed after the exposure, the exposed photoresist was developed with 1,1,1-trichloroethane, washed with water, drained, dried at 80° C. for 20 minutes, and evaluated for the following items. The results are shown in Table 1.

(1) Developing Time

The developing time was defined as the time required for the complete removal of the resist from the hole of a given diameter for the drilled laminates or as the time required for the development of a 100 μm-wide line and space pattern for other laminates.

(2) Degree of Resolution

The degree of resolution was defined as the minimum width of a line and space pattern obtained without deformation or incomplete development when observed under an optical microscope.

(3) Adhesion (JIS K 5400)

The adhesion was tested by making cross cuts in the resist film and peeling them by a cellophane-backed pressure-sensitive tape.

(4) Hardness (JIS K 5400)

The hardness was evaluated by the pencil hardness test.

(5) Electrical Properties

The insulation resistance was measured by forming an electrode by etching and applying a voltage of 500 V for 1 minute.

(6) Heat Resistance in a Soldering Bath

The test specimen was immersed in a soldering bath at 260±5° C. for 60 seconds and observed for changes in appearance and adhesion.

As is apparent from Table 1, Samples A to D of the examples can be developed in a shorter time than Samples E to G of the comparative examples and they can also be developed when applied to substrates with small drilled holes. Sample E contains an excess of the unsaturated polyester of the general formula (II) and shows poor adhesion to the substrate, although presenting no problem in heat resistance and development. Sample F contains less than 10% by weight of the unsaturated polyester of the general formula (II) and suffers cracking and delamination for insufficient heat resistance in a soldering bath. Sample G lacks flexibility, shows poor adhesion to the surface of copper, and is not easy to develop on account of the use of more than an adequate quantity of the novolak epoxy acrylate and dipentaerythritol hexaacrylate (DPHA).

The results prove that the photosensitive resin compositions containing the epoxy acrylate resins of this invention can be developed in a shorter time and are useful as solder resists for substrates with small-diameter throughholes.

TABLE 1

| | Sample | Developing time (second) | | | | | Degree of resolution (μm) | Adhesion | | Hardness | Electrical property (Ω) | Solder heat resistance | |
| | | Surface | Hole diameter (mm) | | | | | Copper | Glass-epoxy resin Laminate | | | Appearance | Adhesion |
| | | | 0.3 | 0.4 | 0.5 | 0.9 | | | | | | | |
|---|---|---|---|---|---|---|---|---|---|---|---|---|---|
| Example | A | 15 | 75 | 45 | 35 | 30 | 50 | 100/100 | 100/100 | 4H | 3 × 10$^{14}$ | No change | No change |
| | B | 10 | 50 | 35 | 30 | 25 | 60 | 100/100 | 100/100 | 5H | 4 × 10$^{14}$ | No change | No change |
| | C | 10 | 55 | 30 | 25 | 20 | 60 | 100/100 | 100/100 | 5H | 3 × 10$^{14}$ | No change | No change |
| | D | 20 | 90 | 60 | 50 | 40 | 60 | 100/100 | 100/100 | 4H | 2 × 10$^{14}$ | No change | No change |
| Comparative example | E | 60 | 160 | 80 | 60 | 30 | 70 | 40/100 | 90/100 | 5H | 3 × 10$^{14}$ | No change | No change |
| | F | 100 | Not developed | Not developed | Not developed | 200 | 60 | 90/100 | 95/100 | 2H | 2 × 10$^{14}$ | Formation of wrinkles | No change |
| | G | 70 | Not developed | Not developed | Not developed | 300 | 100 | 100/100 | 100/100 | 2H | 2 × 10$^{14}$ | Formation of crachs | No change |

What is claimed is:

1. Epoxy acrylate resins represented by the general formula (I)

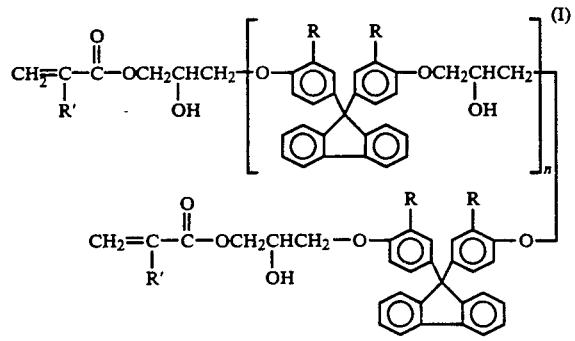

in which R is hydrogen or a lower alkyl group, R' is hydrogen or methyl group, and n is an integer from 0 to 20.

2. Photosensitive resin compositions characterized by containing 15 to 90% by weight of epoxy acrylate resins of the general formula (I)
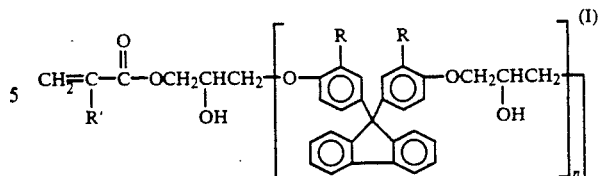
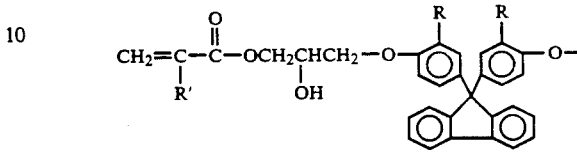
in which R is hydrogen or a lower alkyl group, R' is hydrogen or methyl group, and n is an integer from 0 to 20 and 10 to 85% by weight of at least one compound selected from trifunctional and higher acrylates and epoxy acrylates.
* * * * *